(12) United States Patent
Chung (10) Patent No.: US 10,062,335 B1
(45) Date of Patent: Aug. 28, 2018

(54) ERASURE MECHANISM FOR ELECTRONIC PAPER

(71) Applicant: Amazon Technologies, Inc., Seattle, WA (US)

(72) Inventor: Jerry Yee-Ming Chung, Los Altos, CA (US)

(73) Assignee: Amazon Technologies, Inc., Seattle, WA (US)

(*) Notice: Subject to any disclaimer, the term of this patent is extended or adjusted under 35 U.S.C. 154(b) by 183 days.

(21) Appl. No.: 15/085,057

(22) Filed: Mar. 30, 2016

(51) Int. Cl.
*G09G 3/34* (2006.01)
*G06F 3/02* (2006.01)

(52) U.S. Cl.
CPC ............ *G09G 3/344* (2013.01); *G06F 3/02* (2013.01); *G09G 2300/0426* (2013.01); *G09G 2330/023* (2013.01); *G09G 2330/028* (2013.01); *G09G 2354/00* (2013.01)

(58) Field of Classification Search
None
See application file for complete search history.

(56) References Cited

U.S. PATENT DOCUMENTS

2009/0237351 A1* 9/2009 Kanamori ............... G02F 1/167 345/107
2012/0188295 A1* 7/2012 Joo ......................... G02F 1/167 345/690

* cited by examiner

*Primary Examiner* — Ifedayo Iluyomade
(74) *Attorney, Agent, or Firm* — Lee & Hayes, PLLC (57) ABSTRACT

This application describes techniques for erasing (e.g., smudging, rendering illegible, etc.) images that are presented on display mediums, such as electronic-paper displays. Electronic-paper displays include a layer of electronic ink comprising charged particles suspended in a fluid. When a voltage differential is created across the reading surface, the charged colored particles may rise to the reading surface, retreat to the opposite surface, or suspend somewhere there between, thereby creating a visible image. In some instances described herein, a common electrode is partitioned into at least two sets of elements interleaved with one another. To erase an image, a voltage differential may be driven between these two sets of elements, creating an in-plane electrical field that erases the image.

20 Claims, 10 Drawing Sheets

ERASURE MODE

ERASURE MECHANISM FOR ELECTRONIC PAPER

BACKGROUND

Electronic reader devices have become common in recent years. The reading surfaces of such devices include tiny cells of electronic ink. The electronic ink includes charged particles suspended in a fluid, and selective application of a voltage differential across the reading surface causes the charged colored particles to rise to the surface, thereby creating a visible image. Similarly, a voltage differential is typically applied across the reading surface to erase a displayed image.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

This application describes techniques for erasing (e.g., smudging, rendering illegible, etc.) images that are presented on display mediums, such as electronic-paper displays. As introduced above, electronic-paper displays include a layer of electronic ink comprising charged particles suspended in a fluid. When a voltage differential is created across the reading surface, the charged colored particles may rise to the reading surface, retreat to the opposite surface, or suspend somewhere there between, creating a visible image.

In some instances, electronic-paper displays include black charged particles, and oppositely charged white particles, colored particles, or the like. In each instance, a respective display may include, towards one surface of the display, a common electrode spanning substantially an entirety of the display, as well as multiple pixel electrodes on an opposite surface of the ink layer, with each pixel electrode corresponding to a respective pixel of the display. Within this structure, different voltage differentials may be created to different pixels of the display in order to present a desired image. To do so, a single voltage may be applied to the common electrode (e.g., 0 volts (grounding the electrode), 5 volts, 30 volts, etc.), while differing voltages may be applied to the different pixel electrodes. As such, the charged particles within the different pixels may move to different locations corresponding to the desired pixel values of the respective pixels, thus presenting the image. Further, the charged particles typically remain in these locations until another voltage differential is created across the display, either to render or a new image or erase the existing image. In other words, an image presented on the electronic-paper display is often static and therefore remains in place until a force erases or otherwise changes the image.

Because electronic-paper displays often form a portion of an electronic device having a power source, such as a battery, and dedicated driver circuitry for presenting the images, the images are easily erased at the discretion of an operating user. However, in some instances the electronic-paper display may comprise a display medium disconnected from a device. For instance, a piece of electronic paper that includes the electrodes and the charged particles may be printed to using an electronic-paper printer that provides a voltage differential for presenting an image. An electronic-paper printer may be configured to print images onto the electronic-paper display by charging a rotatable organic photoconductor (OPC) drum and selectively scanning the OPC drum with laser pulses or Light Emitting Diode (LED) array to create areas with different charge levels across the OPC drum. The electronic-paper display is then fed under the rotatable OPC drum thereby causing the specific colored charged electronic ink particles therein to rise to the surface, or move towards the bottom, and leave an image thereon. The electronic-paper printer also, in some instances, includes erase rollers to generate a uniform image across the electronic-paper display prior to printing, discharge rollers to remove latent charges from the surface of the electronic-paper display after printing, and a cleaning roller to remove dust or other debris from the surface of the electronic-paper display. Removing the latent charges from the surface of the electronic-paper display prevents shocking a user or something else after the printing, and also prevents corruption of the image printed thereon. In some instances, the printing apparatus may be a multi-function apparatus also capable of adhering toner to pulp-based paper.

Additionally or alternatively, the piece of electronic paper may detachably couple to a device, such as an electronic reading device, such that the device drives the voltage differential to display the image on the electronic paper when the paper couples to the device. In each of these instances, when the electronic paper is free from the voltage source(s), the image typically remains rendered on the display for an indefinite amount of time. In some instances, however, a user may desire to erase or otherwise erase an image at a time when the display medium is not coupled to a device and an electronic-paper printer is not accessible. In some instances, a user may wish to erase an image for security reasons, privacy reasons or the like.

As such, the display mediums described herein may include functionality for erasing (e.g., smudging, rendering illegible, etc.) images rendered on the display mediums while the display mediums are not coupled to corresponding devices. To do so, one such display medium described herein may include a common electrode that is physically partitioned into multiple sections or elements. These sections or elements may reside adjacent to and coplanar with one another, with a relatively small gap within between each section or element. Further, a first set of these elements may couple to a first voltage source and a second set of the elements may couple to a second, different voltage source, such that a voltage differential may be created between the first set of elements and the second set of elements. In some instances, the first set of elements are interleaved with the second set of elements, creating an "every-other" type of pattern (i.e., first element, second element, first element, second element, etc.).

Further, the example display mediums described herein may include pixel electrodes as described above, with each pixel electrode corresponding to a pixel of the respective display medium. Each pixel electrode may couple to a respective voltage source such that an individual voltage differential may be driven between the common electrode and each pixel electrode for rendering the appropriate pixel value at each respective pixel. For instance, when the display medium operates in a display mode, a common voltage ($V_{com}$) may be applied to both the first and second sets of elements of the common electrode (as in the traditional use of a common electrode) while varying voltages may be applied to the different pixel electrodes in accordance with the desired image, thus resulting in the display medium presenting the image. For instance, when the display medium couples to a device, the device may drive the common voltage ($V_{com}$) to the common electrode while driving the appropriate voltages to the respective pixel electrodes. In the case of an electronic-paper printer, meanwhile, the printer may drive these values likewise. It is noted that because the display mediums described herein present images based on voltage differentials, in some instances creating a voltage differential may include applying voltages of different polarities (e.g., +30V and −30V for a 60V differential), voltages of the same polarity (e.g., +60V and +10V) for a 50V differential), or applying a voltage of one polarity and zero voltage on an opposite side (i.e., "grounding" one of the electrodes).

In addition to above, however, the example display medium may be operable in an erasure mode in which the medium erases the presented image with relatively little power requirements, such that the medium may do so even when detached from an electronic device. As mentioned above, the common electrode may include two sets of interleaved elements coupled to different voltage sources. In some instances, when a user requests to erase an image, the display medium may create a voltage differential between the first and second sets of elements. Because the first and second set of elements are in a common horizontal plane, the application of the voltage differential between these elements creates an electric field within that common plane. That is, because a voltage differential is applied between a first element and a second element that is adjacent and in the same plane as the first element, a horizontal (i.e., in-plane) electric field results between the first and second elements. This in-plane electric field functions to move some or all of the charged particles horizontally and/or vertically, thus erasing the previously presented image.

In some instances, the display medium may include a battery or other power source for providing the electric current to create the in-plane electric field, while in other instances the display medium may include an energy-harvesting component configured to harvest energy for generating the current. For instance, the display medium may include a piezoelectric transducer that generates a voltage upon deformation caused by a user pressing down on a button that resides above the piezoelectric transducer. Further, the display medium may include an erasure actuator, such as a button, that resides beneath the piezoelectric transducer. As such, when the user presses down on the button, the transducer may deform, generating the voltage that is applied to at least one set of elements of the common electrode. In some instances, the first set of elements receives the voltage, while the second set is grounded in response to the button-push event, thus driving a voltage differential between the two sets of elements of the common electrode. In still other instances, the energy-harvester component comprises a solar panel for receiving solar energy, an antenna for receiving power from a radio-frequency (RF) signal or near-field-communication (NFC) signal to generate the voltage, or the like. In one or more of these instances, the display medium may further include a capacitor (e.g., a super capacitor) or other energy-storage component for storing the harvested energy. In some instances, the capacitor may be discharged upon the squeeze of the button or upon another trigger. For instance, in some instances an RF signal (e.g., from a mobile phone or tablet of a user) may both provide the power to drive the voltage differential to the sets of elements of the common electrode as well as the trigger for doing so.

Additional examples and details are illustrated in the figures and described below. Furthermore, as used herein, electronic-paper technologies may include gyricon technologies, electrophoretic technologies, electrowetting technologies, interferometric modulation technologies, other bistable display technologies, and the like.

Figure 1:
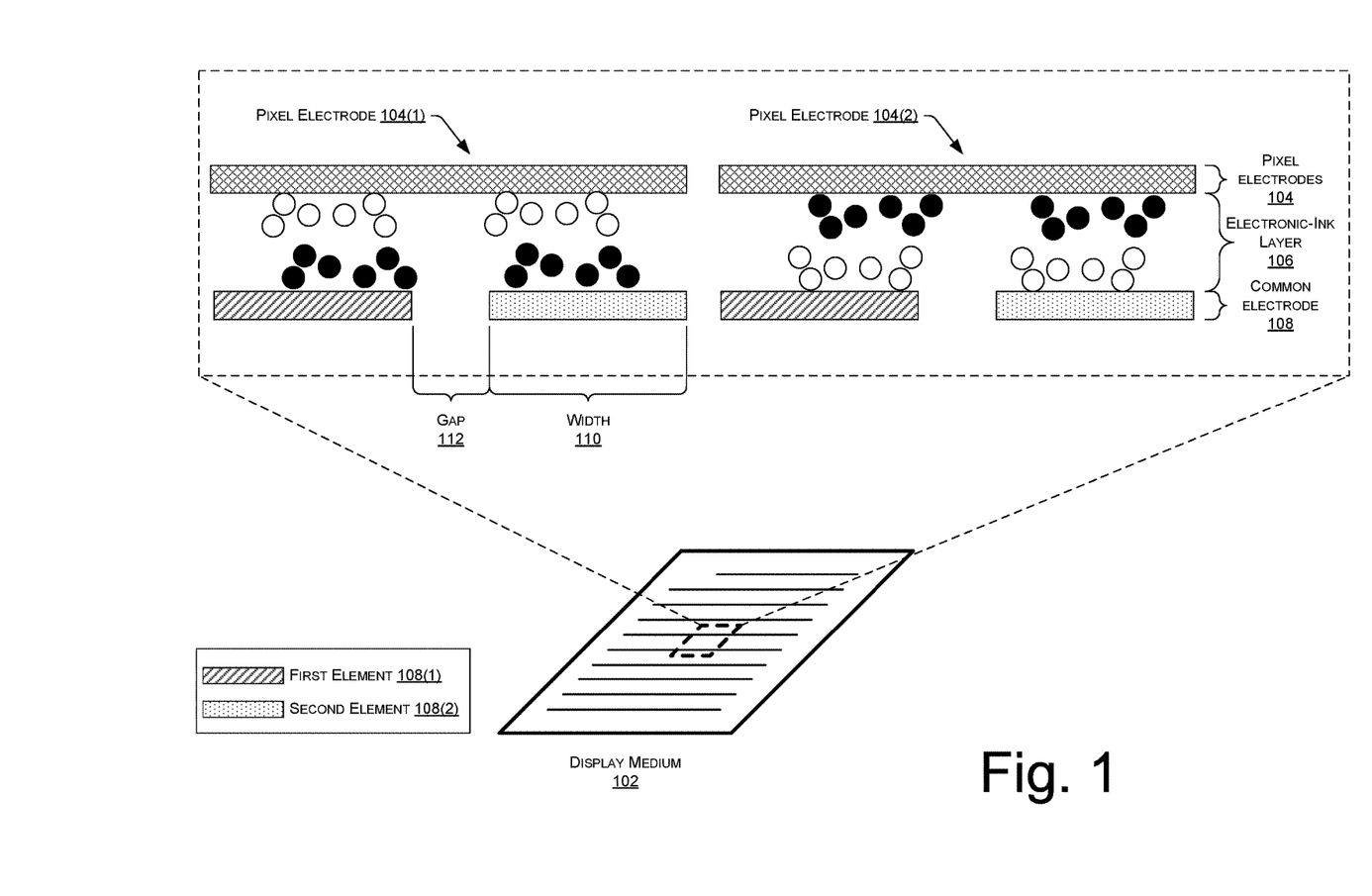
FIG. 1 illustrates a portion of a cross-sectional view of electronic paper having multiple pixel electrodes, an electronic ink layer, and a common electrode that is partitioned into a first set of elements and a second set of elements that are interleaved with the first set.

FIG. 1 illustrates a portion of a cross-sectional view of a display medium 102, such as electronic paper, that is configured to erase a rendered image. In this example, the display medium 102 includes multiple pixel electrodes 104, each corresponding to a particular pixel of the display medium 102. In this example, FIG. 1 illustrates a first pixel including a pixel electrode 104(1) and a second pixel including a pixel electrode 104(2). While FIG. 1 illustrates two pixels for purposes of discussion, it is to be appreciated that the display medium 102 may include thousands of similar pixels.

In addition, the display medium includes a layer of electronic ink 106 comprising one or more colors of charged particles. In the illustrated example, the electronic-ink layer 106 includes black particles of a first charge and white particles of a second, opposite charge, although other implementations may include a single color of charged particles or any other number of colors. Further, the display medium 102 includes a common electrode 108 that is partitioned into a first set of elements and a second set of elements, as discussed below.

To render an image, a voltage differential may be driven between the common electrode 108 and each of the pixel electrodes 104. In some instances, the common electrode 108 corresponds to substantially an entirety of a display region of the display medium 102 and a single voltage is applied across an entirety of the common electrode 108 when rendering an image on the display medium 102. Each pixel electrode, however, may be receive a voltage that is unique to that pixel for rendering whatever pixel value is specified by the image at that particular pixel. Stated otherwise, the different voltage differentials may be driven at the different pixels may applying a common voltage ($V_{com}$) to the common electrode 108 (i.e., to each pixel in the display medium 102) and different respective voltages to the different pixel electrodes 104, such as the pixel electrodes 104(1) and 104(2).

In some instances, the display medium is free from (i.e., does not include) the circuitry for supplying these voltages to render these images. Instead, the display medium 102 may detachably couple to an electronic device configured to provide these voltages or may be inserted and "ran through" an electronic-paper printer that provides these voltages. However the image is displayed, the display medium 102 may be configured to erase the image with a relatively small amount of current, as discussed further below.

As illustrated, the common electrode 108 may be partitioned into a first set of elements 108(1) and a second set of elements 108(2), which may be interleaved with each other in a "every-other" type pattern, such that each element resides between two elements from the other group (except for the elements on the edges of the pattern). While each element of the first and second set of elements may be structurally the same or similar, each element of the first set of elements 108(1) may couple to a first voltage source, while each element of the second set of elements 108(2) may couple to a second, different voltage source. In some instances, each element of the first set of elements 108(1) and each element of the second set of elements 108(2) sits atop a common substrate. For instance, the common electrode may comprise a glass substrate upon which reside strips of indium tin oxide (ITO), with alternating ones of the ITO strips coupled to the respective voltage sources $V_1$ and $V_2$.

Generally, when a user wishes to erase a displayed image, the user may actuate a button or other control for driving a voltage differential between the first and second sets of elements, creating an in-plane electric field that effectively smudges or otherwise erases the image by displacing the charged particles of the electronic ink layer.

As illustrated, each element may have a predefined width 110, and a predefined gap 112 may exist between each element. The size of the electric field may vary depending on the created voltage differential, the size of the width 110, and the size of the gap 112. In some instances, a gap of approximately 10 microns to 100 microns exists between each element of the first set of elements 108(1) of the common electrode 108 and an adjacent element of the second set of elements 108(2). The width 110 of each element, meanwhile, may be approximately 50 microns to 1,000 microns. Further, the created voltage differential may be between 10V and 100V in some instances. It is to be appreciated, however, that these ranges are merely illustrative and that other implementations may utilize other ranges in the width of the common-electrode elements, the gap there between, or the voltage differential created between the first set of elements and the second set of elements. In addition, it is noted that the width and alignment of the elements of the common electrode may or may not correspond in any manner to the pixels (and, hence, pixel electrodes) of the display medium 102. Further, it is to be appreciated that the shape, cross-section and the like of the elements may vary, both within a common display medium 102 and across different implementations of the display mediums.

Figure 2:
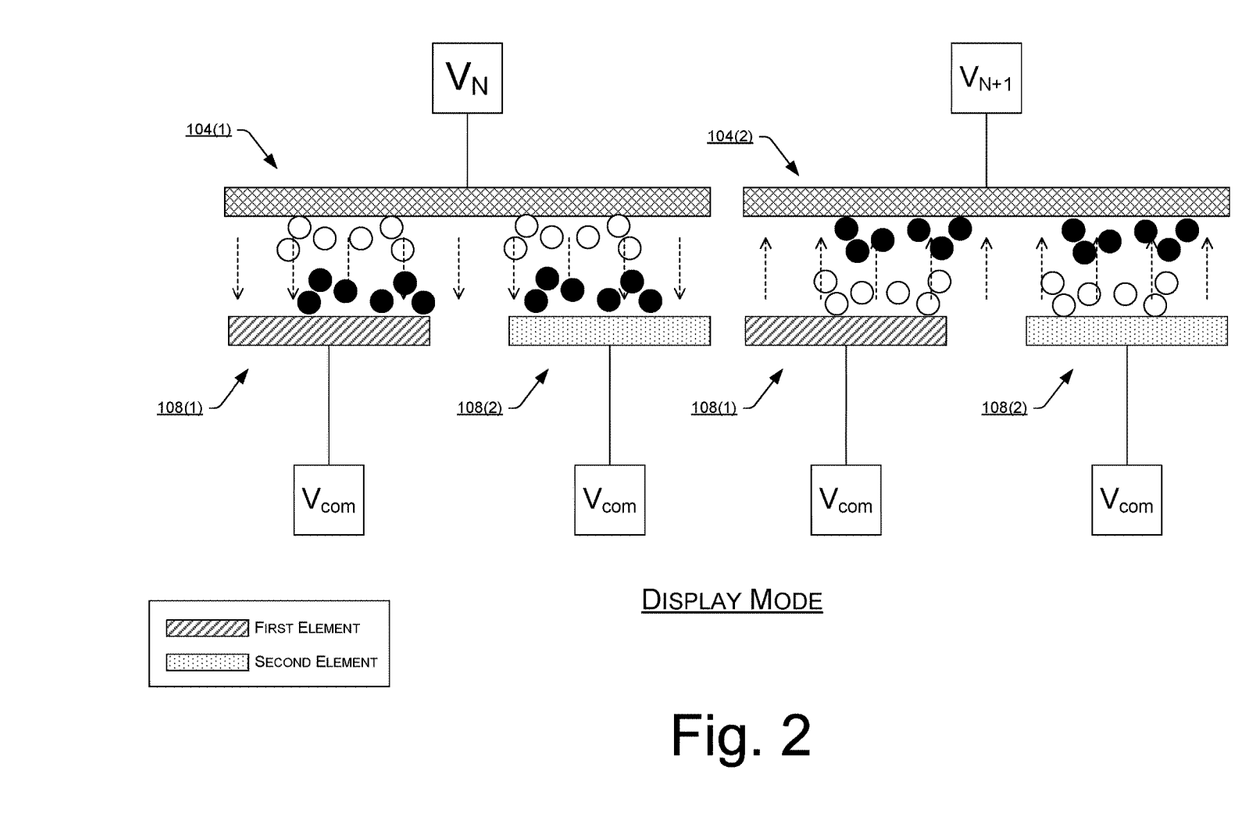
FIG. 2 illustrates how the electronic paper described herein is able to display an image when in a display mode. Here, respective voltage differentials are driven between the pixel electrodes and the common electrode according to the image to be displayed.

FIG. 2 illustrates the display medium 102 operating in a display mode. As illustrated, a common voltage ($V_{com}$) is applied to the first and second elements of the common electrode 108, while other voltages are applied to the pixel electrodes 104. For instance, in this example a voltage of $V_N$ is applied to the first pixel electrode 104(1) while another same or different voltage $V_{N+1}$ is applied to the second pixel electrode 104(2). In this example, the voltage differential drive between the common electrode 108 and the first pixel electrode 104(1) pushes the black charged particles to the bottom of the pixel and attracts the white particles to the top, while the voltage differential drive between the common electrode 108 and the second pixel electrode 104(2) attracts the black charged particles to the top of the pixel and pushes the white particles to the bottom. As mentioned above, in some instances the display medium 102 may be coupled to an electronic device or may be inserted into an electronic-paper printer in order to drive the voltage differentials illustrated in the display mode of FIG. 2.

Figure 3:
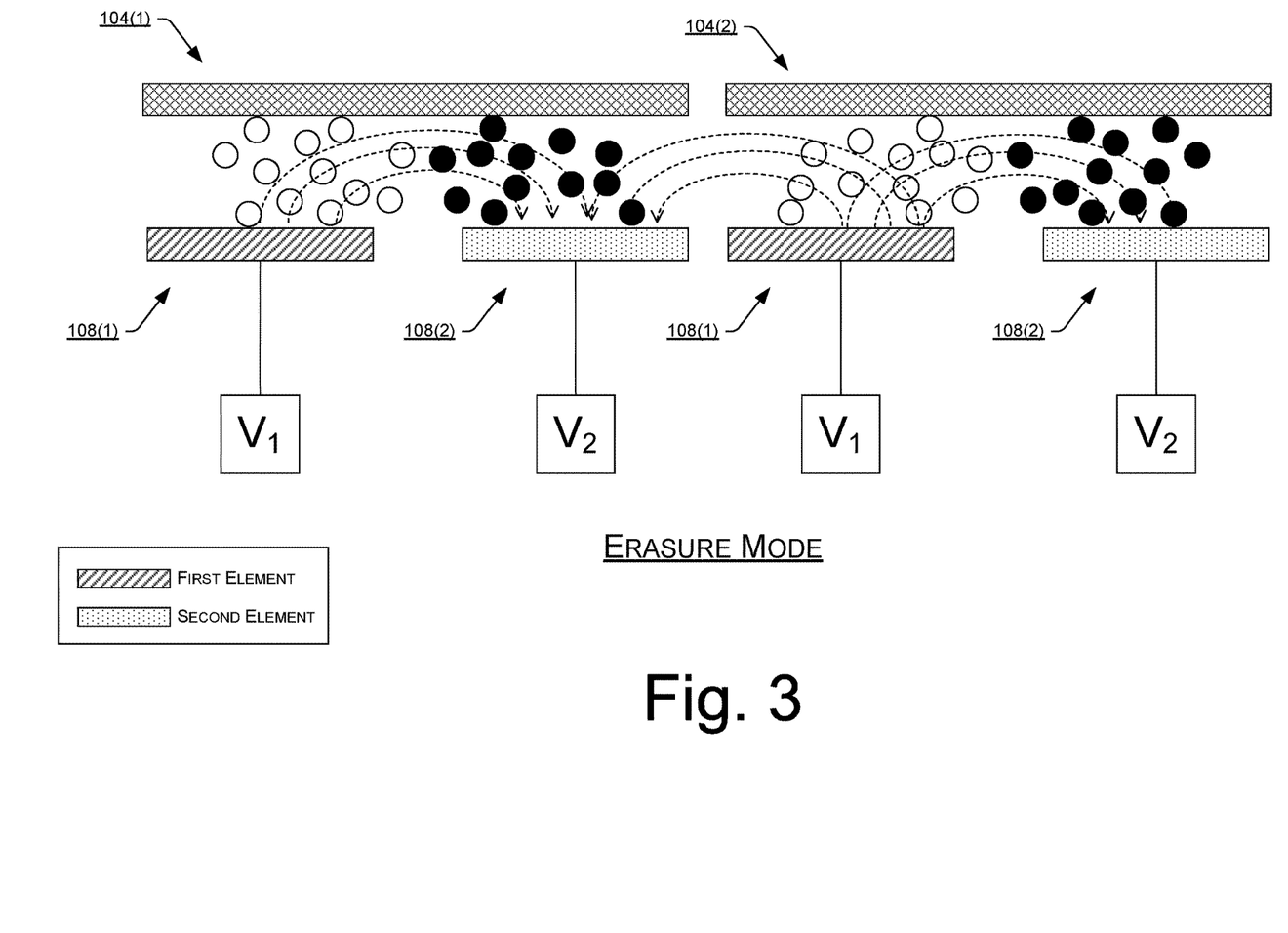
FIG. 3 illustrates how the electronic paper described operates to erase an image displayed on the electronic paper. Here, a voltage differential is driven between the first set of elements of the common electrode and the second set of elements, thus creating an in-plane electric field that erases the displayed image.

FIG. 3, meanwhile, illustrates how the display medium operates to erase a displayed image. As discussed above, the first set of elements 108(1) of the common electrode 108 couple to a first voltage source ($V_1$) while the second set of elements 108(2) couple to a second voltage source ($V_2$). As illustrated, in this example the display medium 102 creates a voltage differential between the first set of elements 108(1) and the second set of elements 108(2), thus creating an in-plane electric field illustrated by the arced arrows. This in-plane electric field functions to displace the charged particles of the electronic-ink layer 106 from their respective positions as part of the displayed image. The in-plane electric field thus erases the displayed image.

To create the voltage differential, the display medium 102 may include a battery, an energy-harvester component, or other power source as discussed above. In some instances, the display medium 102 includes a piezoelectric actuator that, when deformed, generates a voltage which charges a capacitor (e.g., a super capacitor). When the display medium encounters a trigger (e.g., a user pressing down on a button, an antenna sensing an RF or NFC signal, or the like), the capacitor may discharge the electric current, thus creating the voltage differential and the in-plane electric field. In some instances, the first set of elements 108(1) receives a positive or negative voltage while the second set of elements 108(2) is grounded. In other instances, both the first and second set of elements receive voltages of the same or different polarities.

Figure 4:
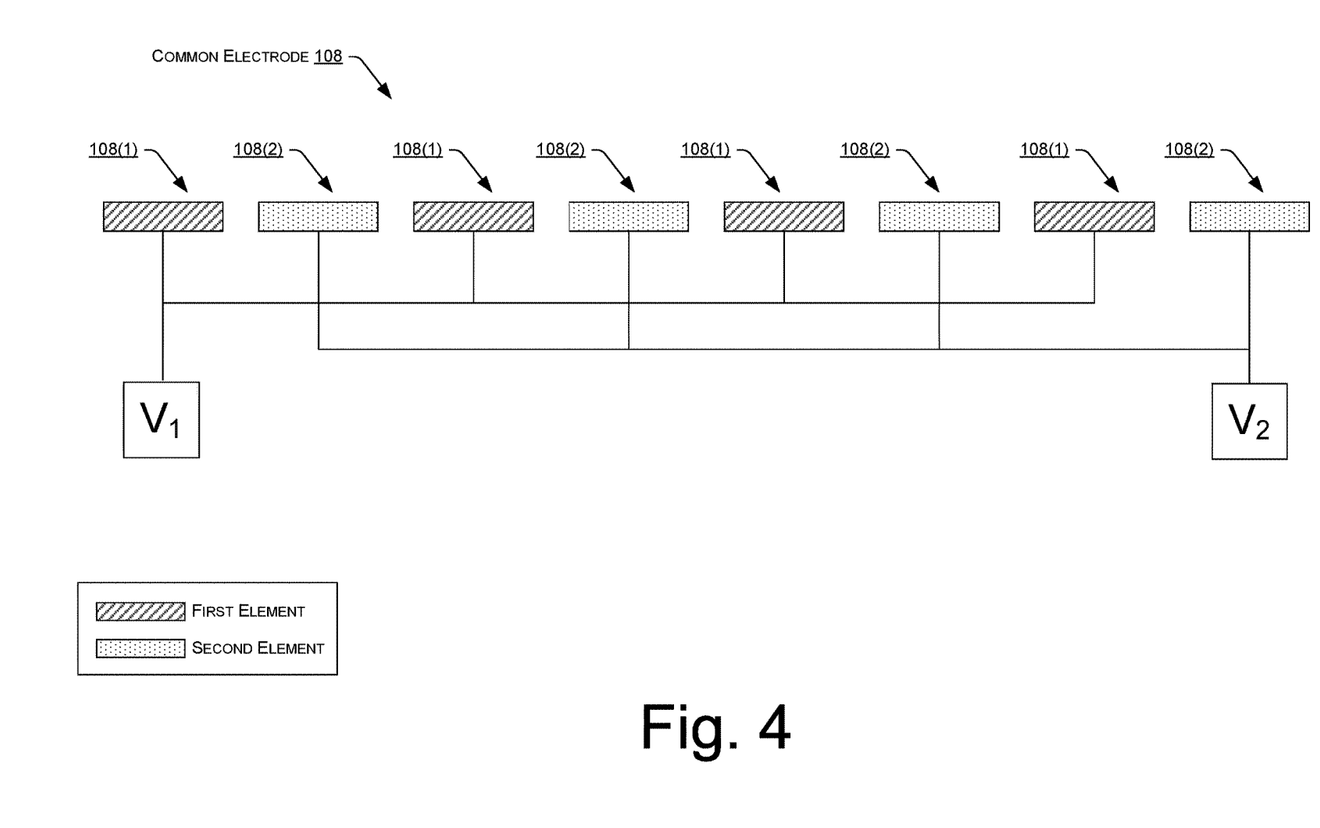
FIG. 4 illustrates a portion of a cross-sectional view of the electronic paper, illustrating that the first set of elements of the common electrode may couple to a first voltage source, while the second set of elements may couple to a second voltage source.
Figure 5:
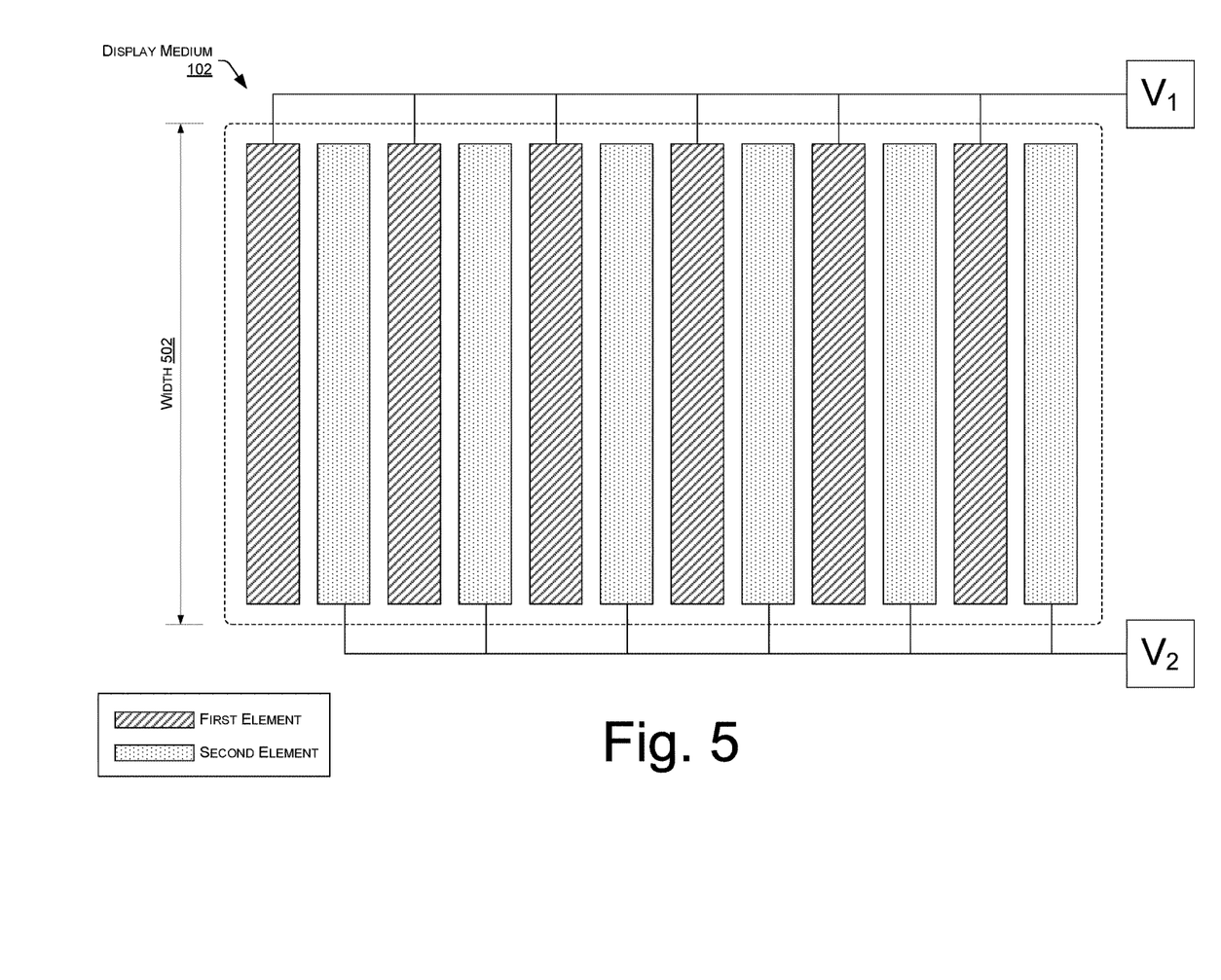
FIG. 5 illustrates a top view of a portion of the electronic paper, showing that the first and second elements making up the common electrode may span substantially an entire width of the electronic paper.
Figure 6:
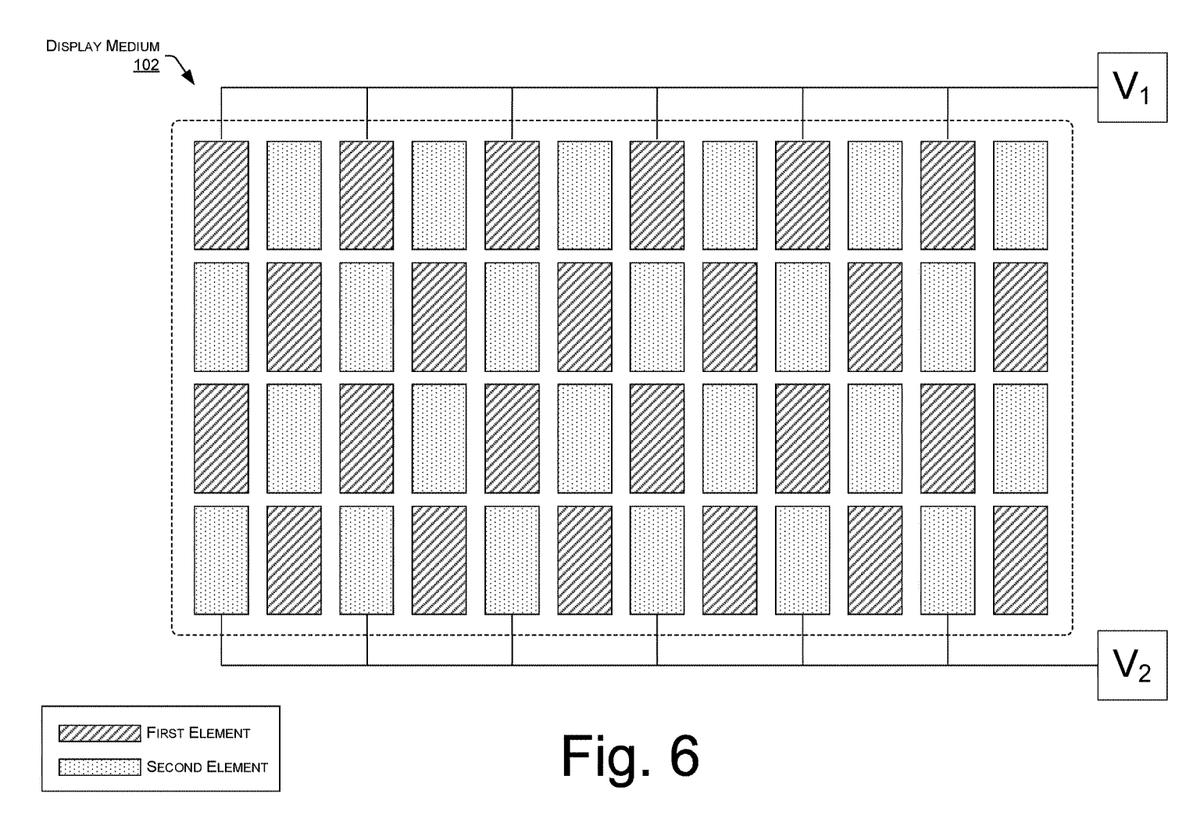
FIG. 6 illustrates a top view of a portion of the electronic paper, showing that the first and second elements making up the common electrode may reside in a checkerboard design.

FIG. 4 illustrates a portion of a cross-sectional view of the common electrode 108. As illustrated, the first set of elements 108(1) of the common electrode may couple to a first voltage source, while the second set of elements 108(2) may couple to a second voltage source. FIG. 5, meanwhile, illustrates a top view of the display medium 102. In this example, the first and second elements of the common electrode are in the form of rectangular strips that span substantially an entire width 502 of a content region on which content is displayed on the display medium (e.g., 80%, 95%, etc.). In other instances, the elements may comprise rectangular strips that lay horizontally such that the elements span substantially an entire length of the display medium 102. In other instances, the elements of the common electrode may be of any other uniform or non-uniform shape. FIG. 6, for instance, that the first and second elements making up the common electrode 108 may reside in a checkerboard design. In each instance, each element of the first set of elements 108(1) may couple to the first voltage source, while each element of the second set of elements couples to the second voltage source.

Figure 7:
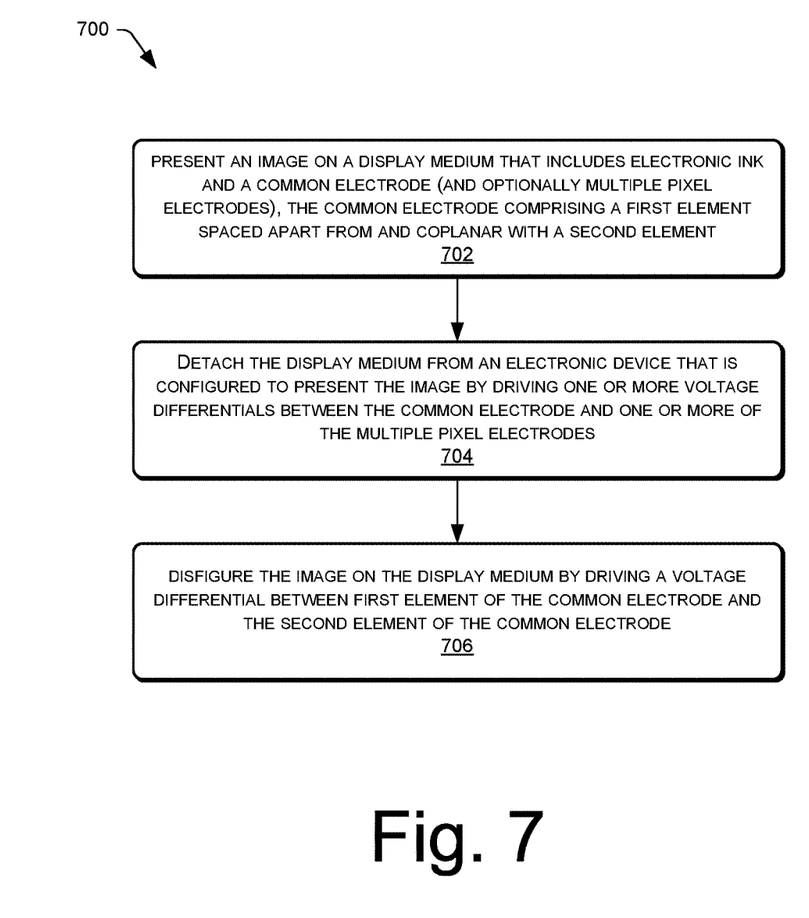
FIG. 7 illustrates a flow diagram of an example process for presenting an image on a piece of electronic paper and erasing the image by driving an in-plane electric field across elements of a common electrode of the electronic paper.

FIG. 7 illustrates a flow diagram of an example process 700 for presenting an image on a display medium (e.g., a piece of electronic paper) and erasing the image by driving an in-plane electric field across elements of a common electrode of the display medium. At 702, an image is presented on a display medium, the display medium including capsules of electronic ink residing and a common electrode that includes at least a first element coplanar with and spaced apart from a second element. In some instances, the display medium includes multiple pixel electrodes for presenting the image (in conjunction with the common electrode). As described above, each pixel electrode may correspond to a pixel of the display medium. In some instances, the display medium may couple to an electronic device when the image is presented. In other instances, meanwhile, the display medium may be free from (i.e., might not include) pixel electrodes. In this example, an electronic-paper printer may provide functionality for presenting the image on the display medium after the display medium is run through the electronic-paper printer.

At 704, in some instances the display medium is detached from the electronic device that is configured to present the image on the display medium by driving one or more voltage differentials between the common electrode and one or more of the multiple pixel electrodes, as discussed above. At 706, when an erasure action is initiated, the image is erased in response to a voltage differential being driven between the first element of the common electrode and the second element of the common electrode. In some instances, the first element is driven to a positive polarity while the second element is driven to a negative polarity. In other instances, the first and second elements are driven to different voltages of the same polarity (positive or negative), or the first element is driven to a first positive or negative voltage with the second element is grounded. An erasure action may comprise a user pressing a button the display medium (e.g., triggering a piezoelectric actuator), a user holding a mobile phone or other electronic device to the display medium (e.g., triggering the process in response to an antenna receiving an RF or NFC signal that is greater than a threshold), or the like.

Figure 8A:
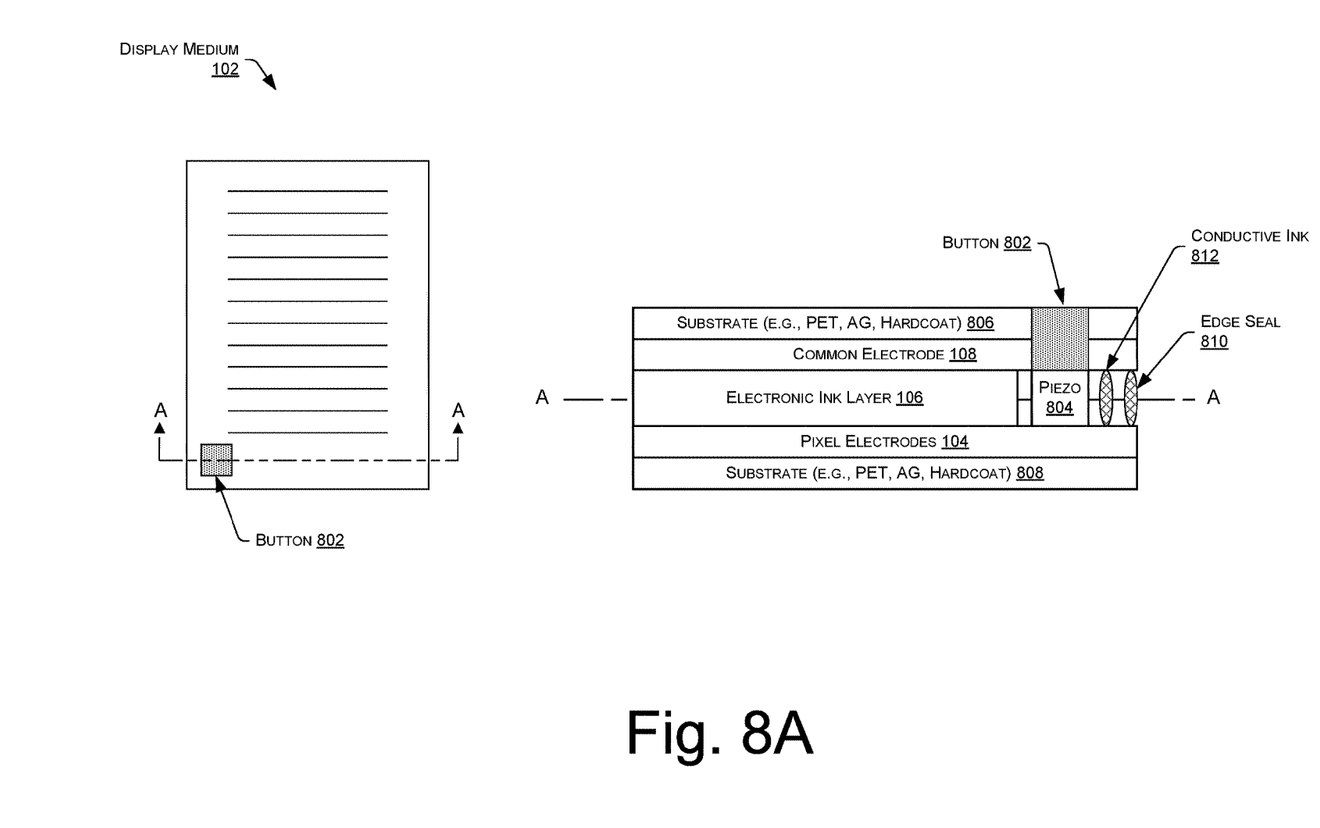
FIGS. 8A and 8B each illustrate a top and a cross-sectional view of a respective example of electronic paper that may include a partitioned common electrode for erasing an image presented on the display.

FIG. 8A illustrates a top and a cross-sectional view of one example of the display medium 102 that may include a partitioned common electrode for erasing an image presented on the display. It is to be appreciated that FIG. 8A illustrates a single example, and that other display mediums may include more, fewer, or different layers made of the same or different materials to those discussed below.

As the top view illustrates, the display medium 102 may include a button 802 that, when actuated, triggers the erasing of the image presented on the display medium. In some instances, the button 802 is depressible by a user of the display medium to erase the image and may include an indication of this functionality, such as the text "Erase Image" printed thereon. In some instances, a piezoelectric actuator 804 may reside underneath the actuator 802 such that a force of the user pressing the button 802 compresses the actuator 804, which is configured to generate a voltage is response to this compression. As described above, the voltage may then be applied to the common electrode to erase the presented image.

In addition to the top view, FIG. 8A illustrates a cross-sectional view of the display medium 102 across the line A-A. In some embodiments, structural layers of the display medium include flexible plastic layers, such as polyethylene terephthalate (PET) or other flexible plastic. In these embodiments, the substrate may include or couple to a moisture barrier, which may comprise of a transparent coating or membrane, including silicon oxide ($SiO_x$), Aluminum Oxide ($Al_2O_3$), polyethelene, polypropylene, or other material that prevents or retards vapor transmission through its cross-section. In some embodiments, the structural layers include thickened moisture barrier layers. In some embodiments, Ultra-violet cut (UV-cut) material may be included to protect material used in other layers. One embodiment may include a UV-cut material built into PET film base to cut or filter out the UV light and protect the other layers.

As discussed above, the display medium 102 includes the electronic-ink layer 106. This layer 106 includes charged colored particles (e.g., ink capsules) suspended in a fluid. The pixel electrodes 104 may reside on one side of the electronic-ink layer 106, while the common electrode 108 may on the opposite side of the layer 106. Some or all of the electrodes described herein may include a transparent conductor fabricated from organic or inorganic materials. An inorganic transparent conductor may include a layer of transparent conducting oxide (TCO), which may include indium tin oxide (ITO), fluorine doped tin oxide (FT), doped zinc oxide, and others. An organic transparent conductor may include carbon nanotubes, graphene, or other. In some instances, a conductor used herein may be plated, coated, or applied with a durable conductive material, such as Copper, Silver, Copper tape, Silver paste, and so forth, which may extend the useful life of the display medium 102.

The common electrode 108, meanwhile, may comprise ITO bonded to a substrate 806 (e.g., a PET layer) via an optically clear adhesive (OCA) layer. The pixel electrodes 104, meanwhile, may thin-film transistors (TFT) bonded to a substrate (e.g., a glass or flexible substrate) 808 via an OCA layer. The display medium 102 may also include an edge seal 810 to protect the electronic-ink layer 106 and other layers from environmental conditions. The medium 102 may also include conductive ink 812 or the like for providing a connection between the pixel electrodes 104 and the common electrode 108. Further, in some instances the display medium may include one or more of a hard coat, an anti-glare (AG) layer, or an anti-reflective (AR) layer, which may include a material to reduce glare and/or reflection from an outside light source. A coating, such as an anti-glare coating, an anti-reflective coating, or an AG/AR coating may be applied to the top of the substrate 806 and a scratch-resistant hard coat may be applied on top of the AG/AR coating.

A hard coat material, as used herein, includes a film or coating that creates a permanent bond with the material it is applied to, and prevents or reduces the appearance of scratches on the surface of the display medium 102. The anti-glare layer and hard coat are, in some embodiments, implemented together. One example is Acrylic mixed with $S_iO_2$ coated on top of the PET layer. The $SiO_2$ particles in the Acrylic provide the profile that scatters and diffuses the light. The thickness of the combined coating could be 3 microns to 50 microns. The hardness measurement is typically measured by abrasive test (with steel wool) and pencil hardness test. Regarding the pencil hardness test, the hardness of electrically printable media according to embodiments may be between 3H to 9H, or other hardness. While a few example layers have been described in the context of an example display-medium structure, it is to be appreciated that other implementations may utilize additional layers, such as moisture barriers, additional edge seals, and the like.

Figure 8B:
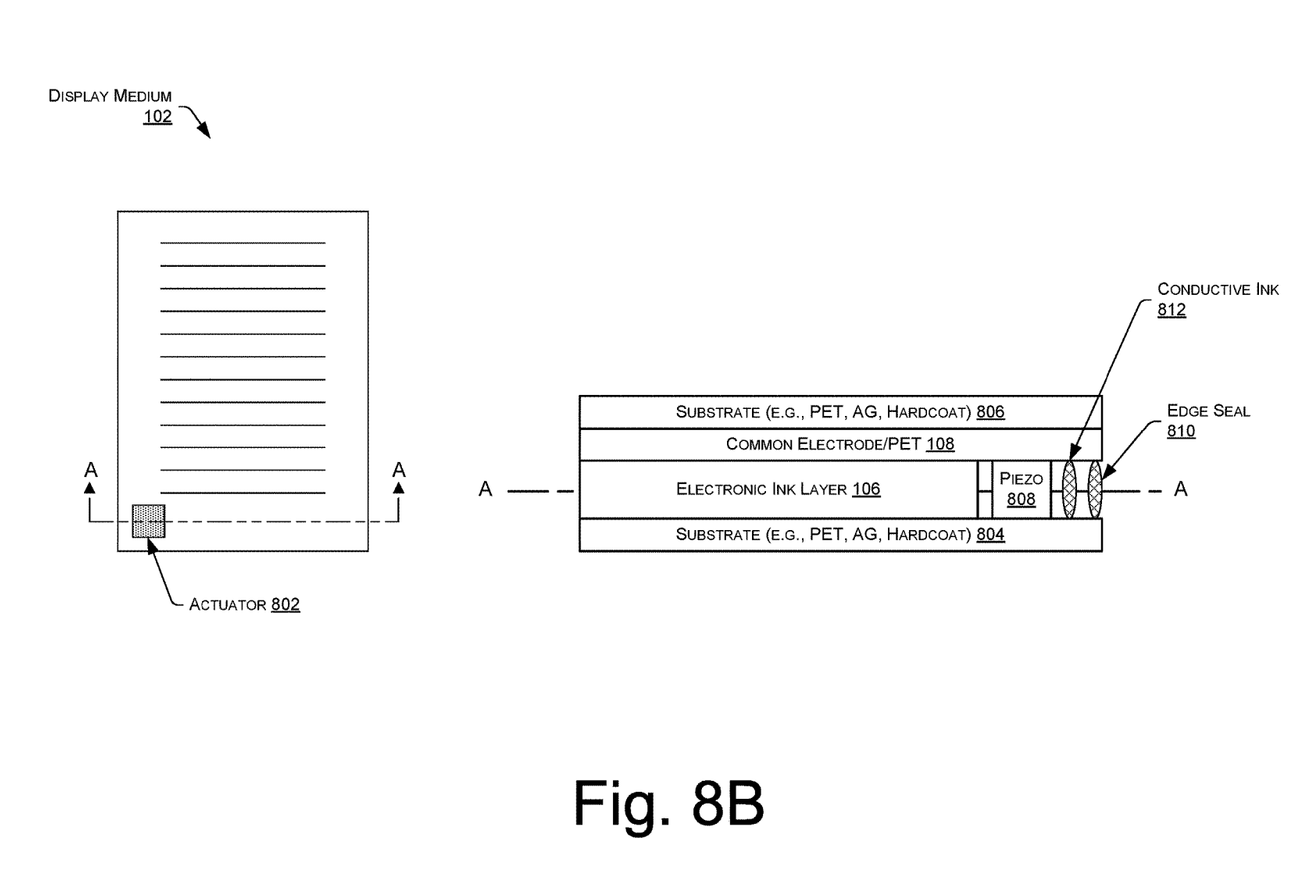

FIG. 8B, meanwhile, illustrates an additional top and a cross-sectional view of one example of the display medium 102 that may include a partitioned common electrode for erasing an image presented on the display. It is to be appreciated that FIG. 8B illustrates a single example, and that other display mediums may include more, fewer, or different layers made of the same or different materials to those discussed below. In this example, the display medium 102 includes many of the same layers as shown in FIG. 8A, although without pixel electrodes. As described above, in some instances the display medium 102 may be run through an electronic-paper printer in order to present an image on the display medium via the electronic-ink layer 106. As such, the electronic-paper printer may provide the substitute for the pixel electrodes. The common electrode 108, meanwhile, remains, functioning to present the image on the display medium (in conjunction with the electronic-paper printer) and to erase the image via the in-plane electromagnetic field described above.

Figure 9:
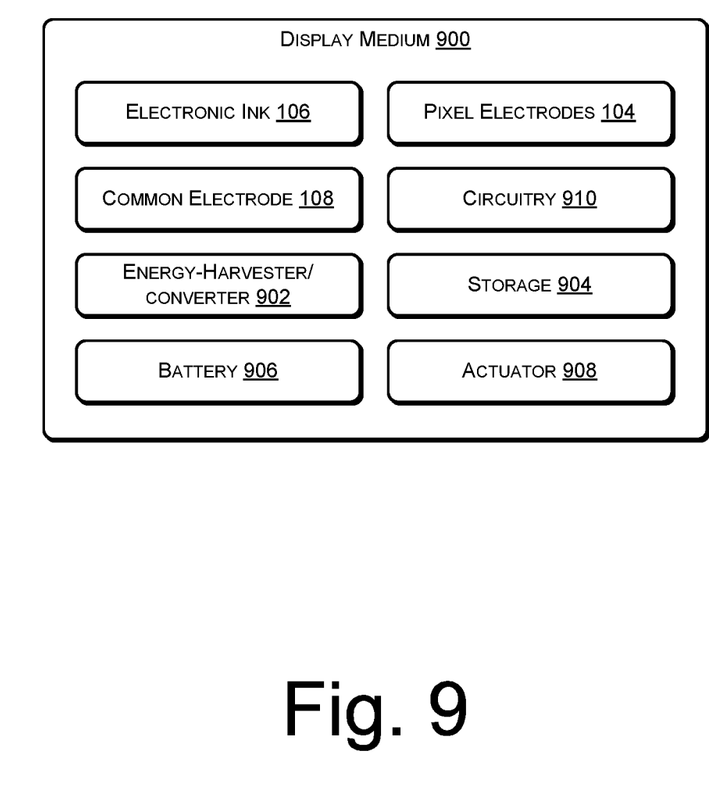
FIG. 9 illustrates a block diagram showing example components of the electronic paper described herein.

FIG. 9 illustrates a block diagram showing example components of a display medium 900, such as those display mediums described herein. As illustrated, the display medium 900 includes the electronic-ink layer 106, the pixel electrodes 104, and the partitioned common electrode 108 described above. In addition, the display medium 900 may include an energy-harvesting component/converter 902 that functions to harvest energy for use in generating a voltage differential to erase an image displayed in the electronic-ink layer 106. As described above, this component 902 may comprise a piezoelectric transducer, a solar panel to collect solar energy, an antenna to collect energy via an RF or NFC signal, or the like along with a converter for converting the captured energy into electric current (e.g., direct-current power). In addition, the display medium may include storage 904 for storing the harvested energy, such as a capacitor or the like. In addition or in the alternative, the display medium 900 may include a battery 906 for driving the voltage differential between the first and second elements of the common electrode 108.

Further, the display medium 900 may include an actuator 908 to trigger the erasing of the displayed image. In some instances, the actuator 908 comprises an element that is actuatable by a user, such as button or other physical component. In one example, the actuatable button 908 deforms the piezoelectric actuator, thus generating the voltage that is used to create the in-plane electric field for erasing the image. In some instances, this energy may be converted into DC power and stored in the storage 904 for later application for erasing the image. In other instances, the voltage generated from the piezoelectric transducer may be applied directly from the transducer to the common electrode for erasing the display without first being converted and stored in the storage 904.

Finally, the display medium 900 may include circuitry 910 for providing the voltage differential to the common electrode 108. For instance, the circuitry 910 may couple the first elements of the common electrode 108 to a first voltage source and the second elements of the common electrode 108 to a second voltage source. Thus, when the actuator 908 triggers the erasing process, the circuitry drives a first voltage to the first set of elements and a second voltage to the second set of elements. For instance, the circuitry 910 may send an electric current to the first set of elements while grounding the second set of elements, thus creating a voltage differential for creating the in-plane electric field for erasing the image. In some instances, when a user depresses the actuatable button, the circuitry coupling the second set of elements of the common electrode 108 to the second voltage source physically touches a grounding element, while the first voltage is driven to the first set of elements.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. An electronic-paper display medium comprising:
a first pixel electrode corresponding to a first pixel of the display medium;
a second pixel electrode corresponding to a second pixel of the display medium;
a layer of electronic ink comprising a first set of charged particles residing beneath the first pixel electrode and a second set of charged particles residing below the second pixel electrode;
a common electrode residing beneath the layer of electronic ink, the common electrode physically partitioned into a first set of elements and a second set of elements, the first set of elements and the second set of elements residing in a horizontal plane and arranged in a pattern such that an element of the first set of elements is adjacent to an element of the second set of elements, wherein the display medium is configured to present an image in response to a first voltage differential created between the first pixel electrode and the common electrode and a second voltage differential created between the second pixel electrode and the common electrode;
a button that is depressible by a user;
a piezoelectric transducer configured to undergo a deformation in response to the user depressing the button and generate a voltage at least partly in response to the deformation; and
circuitry configured to create, at least partly using the voltage generated from the deformation of the piezoelectric transducer, a third voltage differential between the first set of elements of the common electrode and the second set of elements of the common electrode, the third voltage differential to create an electric field that is at least partly within the horizontal plane of the first set of elements and the second set of elements to erase the image presented on the display medium.

2. An electronic-paper display medium as recited in claim 1, wherein the element of the first set of elements is spaced in the horizontal plane from the element of the second set of elements by between approximately 10 microns and 100 microns.

3. An electronic-paper display medium as recited in claim 1, wherein the third voltage differential is created by applying the voltage generated from the deformation of the piezoelectric transducer to the first set of elements and grounding the second set of elements.

4. An electronic-paper display medium as recited in claim 1, wherein the pattern in which the first set of elements and the second set of elements are arranged comprises a checkerboard pattern.

5. A display medium comprising:
a first pixel electrode corresponding to a first pixel of the display medium;

a second pixel electrode corresponding to a second pixel of the display medium;

a layer of electronic ink comprising a first set of charged particles residing beneath the first pixel electrode and a second set of charged particles residing beneath the second pixel electrode, the first set having a first subset of charged particles and a second subset of charged particles, and the second set having a third subset of charged particles and a fourth subset of charged particles;

a common electrode residing beneath the layer of electronic ink, the common electrode partitioned into at least a first element and a second element, the first element and the second element residing in a common plane, wherein the display medium is configured to present an image in response to a first voltage differential created between the first pixel electrode and the common electrode and a second voltage differential created between the second pixel electrode and the common electrode; and circuitry configured to create a third voltage differential between the first element of the common electrode and the second element of the common electrode to create an electric field at least partly within the common plane that erases the image presented on the display medium by causing the first subset of charged particles and the third subset of charged particles to move within the layer of electronic ink toward the first element of the common electrode and by causing the second subset of charged particles and the fourth subset of charged particles to move within the layer of electronic ink toward the second element of the common electrode.

6. A display medium as recited in claim 5, further comprising an energy-harvesting component to generate a voltage that is used to at least partly create the third voltage differential between the first element and the second element.

7. A display medium as recited in claim 6, wherein the energy-harvesting component comprises at least one of a piezoelectric transducer configured to generate the voltage at least partly in response to deformation, a solar panel to collect solar energy to generate the voltage, or an antenna configured to receive a radio-frequency (RF) signal to generate the voltage.

8. A display medium as recited in claim 5, further comprising:
a button that is depressible by a user; and
a piezoelectric transducer located beneath the button, the piezoelectric transducer configured to undergo a deformation upon the user depressing the button and configured to generate a voltage that is used to at least partly create the third voltage differential between the first element and the second element at least partly based on the deformation.

9. A display medium as recited in claim 5, further comprising a battery configured to generate a voltage that is used to at least partly create the third voltage differential between the first element of the common electrode and the second element of the common electrode.

10. A display medium as recited in claim 5, further comprising:
an energy-harvesting component to generate a voltage that is used to at least partly create the third voltage differential between the first element and the second element; and
a capacitor for receiving the voltage from the energy-harvesting component and storing the voltage for creating the third voltage differential between the first element of the common electrode and the second element of the common electrode.

11. A display medium as recited in claim 5, wherein the first element of the common electrode is spaced from the second element of the common electrode by approximately between 10 microns and 100 microns.

12. A display medium as recited in claim 5, wherein:
the display medium includes a content region on which content is displayed, the content region having a defined width and a defined length;
each of the first element of the common electrode and the second element of the common electrode has at least one of a width that is substantially equal to the defined width of the content region or a length that is substantially equal to the defined length of the content region.

13. A display medium as recited in claim 5, wherein the common electrode is partitioned into multiple elements in a checkerboard design, the first element of the common electrode and the second element of the common electrode each forming a portion of the checkerboard design.

14. A display medium as recited in claim 5, wherein the circuitry is configured to create the third voltage differential between the first element of the common electrode and the second element of the common electrode by providing a voltage having a positive polarity to the first element of the common electrode and providing a voltage having a negative polarity to the second element of the common electrode.

15. A display medium as recited in claim 5, wherein the circuitry is configured to create the third voltage differential between the first element of the common electrode and the second element of the common electrode by providing a voltage to the first element of the common electrode and grounding the second element of the common electrode.

16. A display medium as recited in claim 5, wherein:
the circuitry comprises first circuitry; and
the display medium does not include second circuitry to create the first voltage differential between the first pixel electrode and the common electrode and the second voltage differential between the second pixel electrode and the common electrode.

17. A method comprising:
presenting an image on a display medium, the display medium including capsules of electronic ink and a common electrode, the common electrode comprising at least a first element spaced apart from and coplanar with a second element; and
erasing the image from the display medium by creating a voltage differential between the first element of the common electrode and the second element of the common electrode, the voltage differential creating an electric field that erases the image by causing a first set of the capsules of electronic ink to move toward the first element of the common electrode and causing a second set of the capsules of electronic ink to move toward the second element of the common electrode.

18. A method as recited in claim 17, wherein:
the common electrode comprises a first set of elements that includes the first element and a second set of elements that includes the second element;
the first set of elements are interleaved with the second set of elements; and
the voltage differential is created by providing a first voltage having positive polarity to the first set of elements and providing a second voltage having a negative polarity to the second set of elements.

19. A method as recited in claim 17, wherein:
the common electrode comprises a first set of elements that includes the first element and a second set of elements that includes the second element;
the first set of elements are interleaved with the second set of elements; and
the voltage differential is created by providing a voltage to the first set of elements and grounding the second set of elements.

20. A method as recited in claim 17, wherein:
the presenting the image comprises presenting the image on the display medium when the display medium is attached to an electronic device that is configured to present the image on the display medium by creating one or more voltage differentials between the common electrode and one or more pixel electrodes of the display medium, each of the one or more pixel electrodes corresponding to a pixel of the display medium; and
the erasing the image from the display medium comprises erasing the image from the display medium after the display medium has been detached from the electronic device.

* * * * *